(12) United States Patent
Amari et al.

(10) Patent No.: US 6,553,792 B1
(45) Date of Patent: Apr. 29, 2003

(54) RESIST STRIPPING METHOD AND APPARATUS

(75) Inventors: Masahiko Amari, Owariasahi (JP); Yoshiyuki Seike, Owariasahi (JP)

(73) Assignee: Asahi Sunac Corporation, Owariasahi (JP)

(*) Notice: Subject to any disclaimer, the term of this patent is extended or adjusted under 35 U.S.C. 154(b) by 0 days.

(21) Appl. No.: 09/315,853

(22) Filed: May 21, 1999

(30) Foreign Application Priority Data

May 25, 1998 (JP) .......................................... 10-143043

(51) Int. Cl.$^7$ ................................................ B08B 3/02
(52) U.S. Cl. .............................. 68/147; 68/153; 68/198; 68/902
(58) Field of Search ................................ 134/198, 199, 134/902, 147, 148, 153

(56) References Cited

U.S. PATENT DOCUMENTS

| | | | | |
|---|---|---|---|---|
| 4,544,446 A | * | 10/1985 | Cady | |
| 4,716,093 A | * | 12/1987 | Kempf | |
| 4,746,397 A | * | 5/1988 | Maeda et al. | |
| 5,032,217 A | * | 7/1991 | Tanaka | |
| 5,294,261 A | | 3/1994 | McDermott et al. | |
| 5,378,312 A | * | 1/1995 | Gifford et al. | |
| 5,429,912 A | | 7/1995 | Neoh | |
| 5,529,638 A | * | 6/1996 | Lutz | |
| 5,723,019 A | * | 3/1998 | Krusell et al. | |
| 5,792,275 A | * | 8/1998 | Natzle et al. | |
| 5,815,762 A | * | 9/1998 | Sakai et al. | |
| 5,938,860 A | * | 8/1999 | Williams | |
| 5,962,197 A | * | 10/1999 | Chen | |
| 6,116,858 A | * | 9/2000 | Narabayashi | |

FOREIGN PATENT DOCUMENTS

| JP | 64-41217 | | 2/1989 |
|---|---|---|---|
| JP | 1-152457 | * | 6/1989 |

OTHER PUBLICATIONS

IBM Tech. Disclosure Bulletin vol. 36, Issue No. 4 pp 223–224 Apr. 1993.*
IBM Tech. Disclosure Bulletin vol. 30, Issue No. 4, pp 10, Jan. 1988.*
McGraw–Hill Dictionary of Scientific and Technical Terms, fourth edition (1989) pp. 41, 739 and 1012.

* cited by examiner

*Primary Examiner*—Frankie L. Stinson
(74) *Attorney, Agent, or Firm*—Nixon Peabody LLP; David S. Safran

(57) ABSTRACT

A method and an apparatus capable of stripping resist efficiently in a short amount of time. A stripping solution under high pressure is jetted from a nozzle to a rotating wafer. The resist layer on the wafer is applied with the jetted stripping solution, and the resist layer can be efficiently stripped in a short amount of time by the multiplied effect by the physical effect caused by the impact of the jetted stripping solution and the chemical effect of the stripping solution.

5 Claims, 2 Drawing Sheets

RESIST STRIPPING METHOD AND APPARATUS

BACKGROUND OF THE INVENTION

1. Field of the Invention

The present invention generally relates to a resist stripping method and apparatus, and more particularly to a resist stripping method and apparatus which can remove the unnecessary resist from a substrate in a process of a lift-off method.

2. Description of Related Art

A lift-off method is one of the methods in a manufacturing process of semiconductor devices for planarizing a surface of an insulating layer that covers wiring patterns and parts among the wiring patterns on a substrate. In the lift-off method, the wiring patterns are formed on the substrate by etching, or the like, and then the insulating layer with the same thickness as the thickness of the wiring patterns is deposited over the substrate by a method such as a chemical vapor deposition method without removing a resist, which was used as a mask in the etching. Thus, the insulating layer is deposited on the resist and non-resist areas on the substrate, and the areas without the wiring patterns are filled up with the insulating layer. Next, the resist and the insulating layer that is deposited on the resist are stripped, and after that, an insulating layer is further deposited over the substrate. As a result, the insulating layer with a planarized surface can be formed on the substrate on which the wiring patterns are formed.

As described above, the lift-off method requires a process to remove the resist and the insulating layer deposited on the resist. Conventionally, the process is performed by immersing the substrate in stripping solution, which is a chemical solution for removing the resist from the surface of the substrate. However, since the conventional method strips the resist only by a chemical effect of the stripping solution, there are disadvantages in that the method is time consuming, and the resists tend to remain.

SUMMARY OF THE INVENTION

The present invention has been developed in view of the above-described circumstances, and has as its object the provision of a resist stripping method and apparatus that can efficiently strip a resist in a short amount of time.

In order to achieve the above-described object, the present invention is directed to a method for stripping resist from a substrate, comprising the step of: jetting stripping solution to the substrate.

According to the present invention, the resist on the substrate is applied with the jetted stripping solution, and the resist can be efficiently stripped in a short amount of time by the multiplied effect by the physical effect caused by the impact of the jetted stripping solution and the chemical effect of the stripping solution.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

Figure 1:
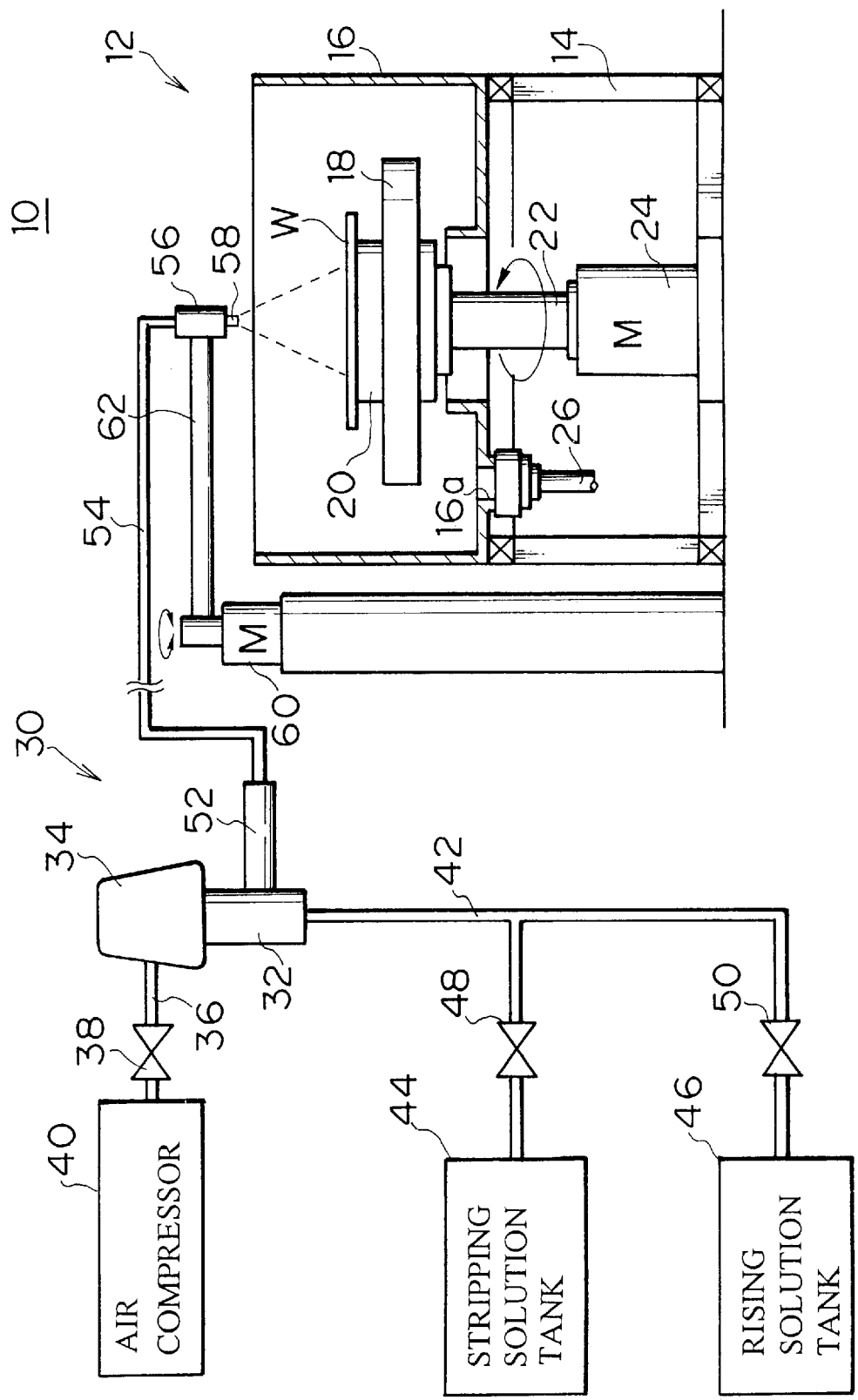
FIG. 1 is a view showing the entire structure of a resist stripping apparatus according to the first embodiment of the present invention.

FIG. 1 shows an entire structure of a resist stripping apparatus according to the first embodiment of the present invention.

As shown in FIG. 1, the resist stripping apparatus 10 comprises a wafer holding device 12 for holding a substrate or a wafer W, and a jetting device 30 for jetting a chemical solution or a stripping solution and a rinsing solution or pure water to the wafer W that is held by the wafer holding device 12.

An explanation is given for a structure of the wafer holding device 12. A disc-shaped turntable 18 is arranged inside a sink 16, which is provided on a stage 14. A suction chuck 20 is provided on the top of the turntable 18, and the wafer W is held on the suction chuck 20 by suction. A spindle 22 is connected to the bottom of the turntable 18, and the lower end of the spindle 22 is connected with an output shaft of a turntable driving motor 24. Driving the turntable driving motor 24 rotates the turntable 18.

Next, an explanation is given for a structure of the jetting device 30. A pressure source of the jetting device 30 is a pump 32, which is operated by an air motor 34. An air compressor 40 is connected to the input side of the air motor 34 via a pipe 36 and a valve 38. Supplying compressed air from the air compressor 40 drives the air motor 34.

The input side of the pump 32 is connected with a stripping solution tank 44 and a rinsing solution tank 46 via a pipe 42. A solution for stripping a resist (i.e. the stripping solution) is stored in the stripping solution tank 44, and a rinsing solution (e.g. pure water) is stored in the rinsing solution tank 46. A first valve 48 and a second valve 50 are arranged on the pipe 42. Operating opening and closing the first valve 48 and the second valve 50 switches the connection with the pump 32. Opening and closing of the first and the second valves 48 and 50 are performed according to operation signals of a controller (not shown).

The output side of the pump 32 is connected with a gun 56 via an accumulator 52 for stabilizing the jetting pressure and a pipe 54. The end of the gun 56 is provided with a nozzle 58, and the stripping solution or the rinsing solution under high pressure is jetted to the wafer W from the nozzle 58.

The gun 56 is supported with the end of an arm 62, which is connected with an output shaft of a motor 60. When the motor 60 is driven for turning the arm 62, the gun 56 is withdrawn from above the wafer W.

In the jetting device 30 with the above-described structure, when the pump 32 is operated by the air motor 34, the stripping solution in the stripping solution tank 44 or the rinsing solution in the rinsing solution tank 46 is sucked into the pump 32 and supplied to the gun 56 under high pressure. Then, the stripping solution or the rinsing solution supplied to the gun 56 is jetted in a state of being atomized (reduced to fine particles).

Operation of the resist stripping apparatus 10 in the first embodiment as constructed above is as follows.

When the wafer W is placed on the suction chuck 20 by a transporting robot (not shown), the wafer W is held on the suction chuck 20 by suction. Then, the turntable driving motor 24 is driven and the turntable 18 rotates so as to rotate the wafer W, which is held on the turntable 18. At the same time, the motor 60 is driven to turn the arm 62 so that the gun 56 is positioned above the wafer W.

Then, the air compressor 40 is operated and the compressed air is supplied to the air motor 34 so as to drive the air motor 34, and the pump 32 is operated by the air motor 34. At this time, the first valve 48 is opened and the second valve 50 is closed. Thus, when the pump 32 is operated, the stripping solution in the stripping solution tank 44 is sucked into the pump 32. The stripping solution sucked into the pump 32 is supplied to the gun 56 under high pressure, and is jetted to the wafer W from the nozzle 58 of the gun 56 in a state of being atomized.

A resist layer on the wafer W is applied with the jetted stripping solution, and is stripped by the chemical effect of the stripping solution. Moreover, the resist layer is cracked by impact caused by collisions with the stripping solution jetted under high pressure; thus dissolution effect by the stripping solution is quickened. Further, because applying the stripping solution under high pressure rinses off the stripped resist, the resist can be efficiently stripped. Furthermore, jetting the atomized stripping solution under high pressure effectively applies the stripping solution to narrow gaps; therefore, the resist can be satisfactorily stripped without remaining. Used-stripping solution is drained via a drainpipe 26 from a drain hole 16a of the sink 16.

The stripping solution is jetted continuously for a predetermined time. The air compressor 40 is stopped after the predetermined time is elapsed. After that, the first valve 48 is closed and the second valve 50 is opened.

Then, the air motor 34 is driven again to operate the pump 32, and the rinsing solution in the rinsing tank 46 is sucked into the pump 32. The rinsing solution sucked into the pump 32 is supplied to the gun 56 under high pressure, and is jetted to the wafer W from the nozzle 58 of the gun 56 in a state of being atomized.

The wafer W is applied with the jetted rinsing solution, and the stripping solution that is adhered to the surface of the wafer W is rinsed off from the wafer W. The rinsing solution is jetted continuously for a predetermined time. The air compressor 40 is stopped after the predetermined time is elapsed. After that, the motor 60 is driven to turn the arm 62, so that the gun 56 is withdrawn from above the wafer W.

On the other hand, the turn table 18 is rotated continuously even after the jetting of the rinsing solution is stopped; thus the remaining rinsing solution on the wafer W is shaken off by the centrifugal force by the rotation of the turn table 18; whereby the wafer W is dried. The wafer W is dried continuously for a predetermined time. The turntable driving motor 24 is stopped after the predetermined time is elapsed. Then the suction chuck 20 relieves the wafer W of the suction when the rotation of the turn table 18 is stopped completely, and the wafer W on the suction chuck 20 is transported to the next process by the transporting robot (not shown).

As described above, according to the resist stripping apparatus 10 in the first embodiment of the present invention, the resist can be efficiently stripped in a short amount of time by the multiplied effect by the physical effect caused by the impact of the stripping solution jetted under high pressure and the chemical effect of the stripping solution. Moreover, the multiplied effect inhibits burrs from generating in boundaries between the wiring patterns and an insulating layer on the wafer W.

In addition, an explanation is given for the jetting pressure of the stripping solution or the rinsing solution jetted from the nozzle 58. If the jetting pressure is less than 3 MPa, the physical effect caused by the impact of the stripping solution is not sufficiently achieved, and if the jetting pressure is over 50 MPa, elements on the wafer W would be damaged. Accordingly, the jetting pressure is preferably set in a range between 3 MPa and 50 MPa.

In the first embodiment, the stripping solution or the rinsing solution is jetted with the gun 56 being fixed at a certain position; however the stripping solution or the rinsing solution may be jetted while the gun 56 is horizontally moving. In other words, the motor 60 is driven to swing the arm 62 in a predetermined angle range while the stripping solution or the rinsing solution is being jetted, and then the stripping solution or the rinsing solution may be jetted while the gun 56 is reciprocating. The moving mechanism is not limited to that; the moving mechanism may be constructed to horizontally slide the gun 56.

In the first embodiment, there is only one nozzle to jet the stripping solution or the rinsing solution; however multiple nozzles may be arranged to jet the stripping solution or the rinsing solution from plural locations. The multiple nozzles may be linearly or circularly arranged.

In the first embodiment, the pump 32 is operated by the air motor 34; however a hydraulic motor, an electric plunger, or the like may be used to operate the pump 32. Further, the rinsing solution may be chemical solution rather than pure water.

Figure 2:
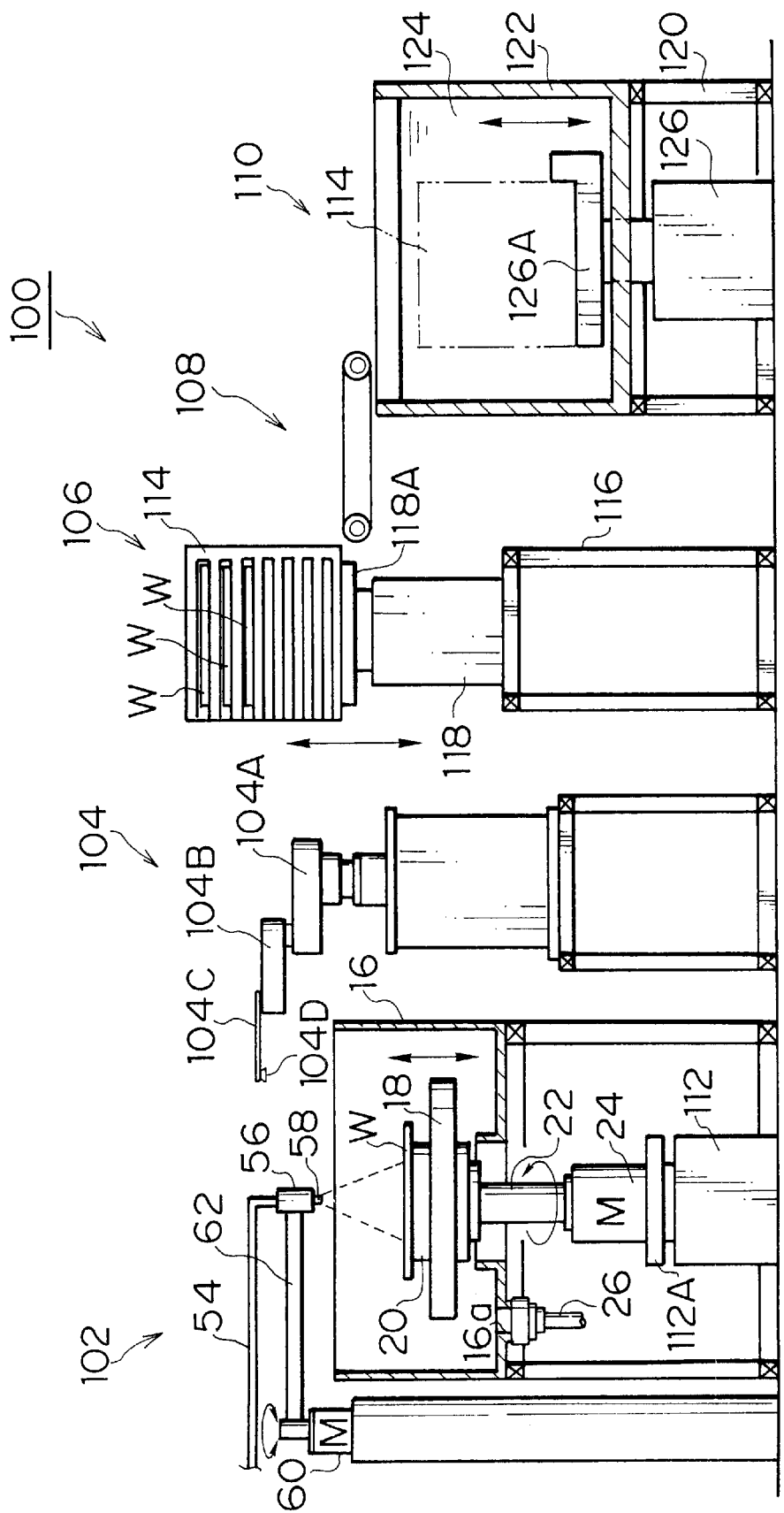
FIG. 2 is a view showing the entire structure of a resist stripping apparatus according to the second embodiment of the present invention.

FIG. 2 shows the entire construction of a resist stripping apparatus according to the second embodiment of the present invention.

As shown in FIG. 2, the resist stripping apparatus 100 of the second embodiment comprises a jetting type resist stripping apparatus 102, a transporting robot 104, a wafer collecting device 106, a cassette transporting device 108, and an immersing type resist stripping apparatus 110.

The jetting type resist stripping apparatus 102 differs from the resist stripping apparatus 10 of the first embodiment in that the turn table 18 is constructed to be able to move up and down. In other words, the turntable driving motor 24 for driving the turntable 18 is installed on a lifting table 112A of a lifting device 112. Operating the lifting device 112 moves the turntable 18 up and down. The other structures of the jetting type resist stripping apparatus 102 is the same as the structures of the resist stripping apparatus 10 of the first embodiment; thus the members which are similar to those described with reference to FIG. 1 are denoted by the same reference numerals, and they will not be explained.

The transporting robot 104 receives the wafer W on the suction chuck 20 of the turn table 18, which is lifted up to a predetermined receiving position, and the transporting robot 104 stores the wafer W into a cassette 114 of the wafer collecting device 106. The transporting robot 104 has multi-joints. The end of a first arm 104A, which is able to turn, has a second arm 104B, which is also able to turn, and the end of the second arm 104B has a hand 104C, which is able to turn as well. The wafer W is held by a suction pad 104D, which is provided at the end of the hand 104C, and transported horizontally.

The wafer collecting device 106 has a cassette lifting device 118 on a stage 116. The cassette 114 is positioned and placed on a lifting table 118A of the cassette lifting device 118, and the wafers W are stored one by one separately in the cassette 114. The cassette lifting device 118 lifts the cassette 114 one level each time one wafer W is stored in the cassette 114; thus the wafers W that are horizontally transported by the transporting robot 104 are stored one by one in the cassette 114.

The cassette transporting device 108 comprises a belt conveyer. The transporting device 108 transports the cassette 114 from the lifting table 118A of the wafer collecting device 106 to a lifting table 126A of the immersing type resist stripping apparatus 110.

The immersing type resist stripping apparatus 110 immerses the wafers W in the stripping solution 124 in order to strip the resist on the wafer W. The immersing type resist stripping apparatus 110 has a stripping vessel 122 installed on a stage 120, and the stripping solution 124 is stored in the stripping vessel 122. The stripping vessel 122 has the lifting table 126A on which the cassette 114 is placed, and the lifting table 126A is operated by a lifting device 126 and moved up and down in the stripping vessel 122.

The operation of the resist stripping apparatus 100 in the second embodiment as constructed above is as explained below.

First, the wafer W is placed on the suction chuck 20 of the jetting type resist stripping apparatus 102 by the transporting robot (not shown), and the wafer W is held on the suction chuck 20 by suction. Next, the turntable driving motor 24 is driven and the turntable 18 rotates so as to rotate the wafer W, which is held on the turntable 18. At the same time, the motor 60 is driven to turn the arm 62, and the gun 56 is positioned above the wafer W.

Then, the pump 32 is operated (see FIG. 1) and the stripping solution under high pressure is jetted from the nozzle 58 of the gun 56 to the wafer W in the state of being atomized. The resist layer on the wafer W is applied with the jetted stripping solution, and is stripped by the chemical effect of the stripping solution. Moreover, the resist layer is cracked with the impact caused by the collisions of the stripping solution jetted under high pressure. Thus, the dissolution effect by the stripping solution is quickened.

The stripping solution is jetted continuously for a predetermined time, and after the predetermined time is elapsed, the pump 32 is stopped. Then, the motor 60 is driven to turn the arm 62, and the gun 56 is withdrawn from above the wafer W. At the same time, the turntable driving motor 24 is stopped, and the turntable 18 is stopped.

Then, the lifting device is operated to lift up the turntable 18 to the predetermined receiving position, and the suction chuck 20 relieves the wafer W of suction. After that, the wafer W is received from the suction chuck 20 by the transporting robot 104, and the wafer W is stored in the cassette 114 of the wafer collecting device 106.

By the above-described sequential process, the jetting type resist stripping from the first wafer W is completed. The same sequential processes are performed to strip the resist of the second and third wafers, and so on. When all the wafers W are stored in the cassette 114, the jetting type resist stripping is completed.

Next, the cassette transporting device 108 is operated to transport the cassette 114 that is placed on the lifting table 118A to the lifting table 126A of the immersing type resist stripping apparatus 110. At this time, the lifting table 126A is positioned at a predetermined receiving position.

The lifting table 126A on which the cassette 114 is placed is moved down by the lifting device 126; thereby the cassette 114 is immersed in the stripping solution 124, which is stored in the stripping vessel 122. The resist on the wafers W in the cassette 114 that is immersed in the stripping solution 124 is stripped by the chemical effect of the stripping solution 124.

The wafers W are immersed in the stripping solution 124 for a predetermined time. Since the jetting type resist stripping from the wafers W have already been performed, thus the immersing can be completed in a short amount of time. Moreover, the resist layers have been cracked by the jetting type resist stripping, thus the corrosion effect by the stripping solution is quickened, and the resist can be easily stripped.

When the predetermined time is elapsed since the cassette 114 is immersed in the stripping solution 124, the lifting device 126 is operated and the lifting table 126A is moved up so as to lift up the cassette 114 from the stripping solution 124. Then the lifted-up cassette 114 is transported to the next process by a transporting means (not shown).

As described above, the resist stripping apparatus 100 of the second embodiment can strip the resist more reliably by jointly using the jetting type resist stripping and the immersing type resist stripping. In other words, because the resist layer is cracked by the jetting type resist stripping beforehand, the dissolution effect of the stripping solution is quickened at the immersing type resist stripping; consequently the resist can be efficiently stripped in a short amount of time.

In the second embodiment, the jetting type resist stripping is performed by jetting the stripping solution; however liquid (e.g., pure water) which is not the stripping solution may be jetted. In this case, the resist can not be stripped with the chemical effect of the stripping solution, but the resist can be cracked by colliding with the jetted liquid under high pressure. Thus, the resist can be efficiently stripped in a short amount of time at the immersing type resist stripping.

In the second embodiment, the immersing type resist stripping is performed after the jetted type resist stripping is performed, but they may be performed in the reverse order. That is, the resist may be stripped by immersing the wafer W in the stripping solution at first for a predetermined time and then applying the stripping solution under high pressure to the wafer W for a predetermined time. In this case, the resist in narrow gaps that could not be removed by the immersing type resist stripping can be satisfactorily removed by the jetting type resist stripping. In this case, if the stripping solution is jetted and then the rinsing solution under high pressure is jetted for the predetermined time and after that the spinning drying is performed as described in the first embodiment, the resist stripping, rinsing, and drying of the wafer W can be sequentially performed, so that the process efficiency of the wafer W is improved.

Further, according to the following procedure, the resist can be more efficiently stripped.

First, the liquid, which may be the stripping solution, or it may not, under high pressure (approximately 15 MPa) is jetted to the wafer W for a predetermined time in order to crack the resist layer. Next, the wafer W is immersed in the stripping solution for a predetermined time. Then the stripping solution under high pressure (approximately 5 MPa) is jetted to the wafer W. By this procedure, the resist can be efficiently removed. Same as the procedure described above, this case also can improve the process efficiency of the wafer W if the jetting type resist stripping using the stripping solution is performed and then the rinsing solution under high pressure is jetted for the predetermined time and next the spinning drying is performed, the resist stripping, rinsing and drying of the wafer can be sequentially performed, so that the process efficiency of the wafer W is improved.

Additionally, because of the same reason as the first embodiment, the range of the jetting pressure of each solution from the nozzle 58 is preferably set to be 3 MPa–50 MPa.

As described above, according to the resist stripping method and apparatus of the present invention, the resist on the substrate is stripped by the physical effect caused by the impact of the jetted stripping solution, and the chemical effect of the stripping solution. Therefore, the resist on the substrate can be efficiently removed in a short amount of time by the multiplied effect by the chemical and physical effects.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An apparatus for stripping resist from a substrate, comprising:

a table for supporting the substrate; and a jetting device for jetting stripping solution to the substrate on the table at sufficiently high fluid pressure to achieve a collective removal effect of physically cracking the resist due to the impact of the jetted fluid without damaging the substrate combined with a chemical removal by the stripping solution of the resist from the substrate.

2. The apparatus of claim 1, wherein the jetting apparatus jets the stripping solution under pressure substantially 3 MPa to substantially 50 MPa, whereby the jetted stripping solution is reduced to fine particles.

3. The apparatus of claim 1, further comprising:

a vessel for storing the stripping solution; and an immersing device for immersing the substrate into the stripping solution in the vessel.

4. The apparatus of claim 1, further comprising:

a jetting device for jetting rinsing solution to the substrate.

5. The apparatus of claim 1, wherein the jetting apparatus jets the stripping solution under a pressure of between 3 MPa and 50 MPa, whereby the jetted stripping solution is reduced to fine particles.

* * * * *